US012563987B2

(12) United States Patent
Motokawa et al.

(10) Patent No.: US 12,563,987 B2
(45) Date of Patent: Feb. 24, 2026

(54) PLASMA PROCESSING METHOD AND PLASMA PROCESSING SYSTEM

(71) Applicant: Tokyo Electron Limited, Tokyo (JP)

(72) Inventors: Kyuri Motokawa, Miyagi (JP); Yuya Minoura, Miyagi (JP); Muneyuki Omi, Miyagi (JP); Koki Tanaka, Miyagi (JP); Ryu Nagai, Miyagi (JP); Nobuhiko Shirahama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 660 days.

(21) Appl. No.: 17/955,073

(22) Filed: Sep. 28, 2022

(65) Prior Publication Data

US 2023/0100292 A1      Mar. 30, 2023

(30) Foreign Application Priority Data

Sep. 29, 2021      (JP) ................................. 2021-158697
Sep. 26, 2022      (JP) ................................. 2022-152372

(51) Int. Cl.
H01L 21/3065      (2006.01)
H01L 21/02      (2006.01)
H01L 21/67      (2006.01)

(52) U.S. Cl.
CPC .... H01L 21/3065 (2013.01); H01L 21/02274 (2013.01); H01L 21/0234 (2013.01); H01L 21/67063 (2013.01)

(58) Field of Classification Search
CPC ........................... H10D 86/215; H01J 37/3266
See application file for complete search history.

(56) References Cited

U.S. PATENT DOCUMENTS 7,214,576 B1 *    5/2007   Kaneko ................ H10D 86/215
                                                                          438/258

FOREIGN PATENT DOCUMENTS

| | | | | |
|---|---|---|---|---|
| JP | 2016012712 A | * | 1/2016 | ......... C23C 16/4404 |
| JP | 2018-133483 A | | 8/2018 | |
| KR | 202180083264 A | | 7/2018 | |
| KR | 20200144479 A | | 12/2020 | |
| KR | 20210108322 A | | 9/2021 | |

* cited by examiner

*Primary Examiner* — Andrew J Bowman

(74) *Attorney, Agent, or Firm* — XSENSUS LLP

(57) ABSTRACT

A plasma processing method includes (a) forming a first protective film on a surface of an inner member of a chamber by a first processing gas including a precursor gas that does not contain halogen; and (b) performing plasma processing on a processing target that is carried in inside the chamber by a plasma of a second processing gas after the first protective film is formed on the surface of the member.

10 Claims, 5 Drawing Sheets

(a)

(b)

P1 (CxHy)

M

START

FORMATION OF FIRST
PROTECTIVE FILM (PRE-COATING) — T1

FORMATION OF SECOND
PROTECTIVE FILM (PRE-COATING) — T2

ETCHING OF SUBSTRATE — T3

REMOVAL OF SECOND
PROTECTIVE FILM — T4

REMOVAL OF FIRST
PROTECTIVE FILM — T5

END

P2

P1

M

PLASMA PROCESSING METHOD AND PLASMA PROCESSING SYSTEM

CROSS-REFERENCE TO RELATED APPLICATIONS

This application is based on and claims priority from Japanese Patent Application Nos. 2021-158697 and 2022-152372, filed on Sep. 29, 2021, and Sep. 26, 2022, respectively, with the Japan Patent Office, the disclosures of which are incorporated herein in their entirety by reference and priority is claimed to each.

TECHNICAL FIELD

The present disclosure relates to a plasma processing system and a plasma processing method.

BACKGROUND

Japanese Patent Laid-open Publication No. 2018-133483 discloses a plasma processing method for etching a silicon-containing film. The plasma processing method includes coating an inner portion of a chamber with a carbon film, supplying a gas that includes a fluorocarbon-containing gas to an inner portion of the chamber after the coating, and etching the silicon-containing film by a plasma to be generated.

SUMMARY

A plasma processing method of an aspect of the present disclosure includes (a) forming a first protective film on a surface of an inner member of a chamber by a first processing gas including a precursor gas that does not contain halogen; and (b) performing plasma processing on a processing target that is carried in inside the chamber by a plasma of a second processing gas after the first protective film is formed on the surface of the member.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
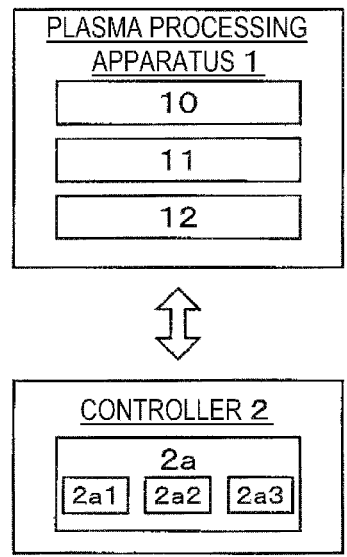
FIG. 1 is a diagram for explaining an example of a configuration of a plasma processing system.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

In the process of manufacturing a semiconductor device, a plasma processing apparatus performs plasma processing such as etching or film formation processing on a semiconductor substrate (hereinafter referred to as a "substrate"). In a plasma processing apparatus, a processing gas is excited inside of a chamber so as to generate a plasma, and the substrate is processed by the plasma.

Before the plasma processing, a so-called pre-coating is performed on a surface of an inner member of the chamber (hereinafter, may be referred to as a "chamber inner member"). The pre-coating is used to coat a protective film on the surface of the chamber inner member in order to stabilize the plasma processing or suppress the consumption of the chamber inner member when the plasma processing is performed. As the pre-coating, for example, in the plasma processing method described in Japanese Patent Laid-open Publication No. 2018-133483 described above, the inner portion of the chamber is coated with a carbon film.

The protective film of the pre-coating is removed after the plasma processing is performed for a predetermined period, and a new protective film is coated on the surface of the chamber inner member again. That is, the pre-coating of the protective film, the plasma processing, and the removal of the protective film are repeatedly performed, and the plasma processing is continuously performed.

However, as a result of diligent studies by the present inventors, it was found that a result of the plasma processing may shift and a rate of the plasma processing may vary over time depending on the type of protective film of pre-coating. Further, when the chamber inner member was confirmed in a case where the result of the plasma processing was shifted in this way, it was confirmed that the chamber inner member was damaged. Therefore, there is room for improvement in the conventional pre-coating before the plasma processing.

The technique according to the present disclosure has been made in consideration of the above-described circumstances, and pre-coating is appropriately performed on the surface of the inner member of the chamber before the plasma processing. Hereinafter, a plasma processing system and a plasma processing method according to the present embodiment will be described with reference to the drawings. The same reference numerals will be given to elements having substantially the same functional configurations throughout the specification and the drawings, and redundant description thereof will be omitted.

<Plasma Processing System>

First, a plasma processing system according to an embodiment will be described. FIG. 1 is a diagram for explaining an example of a configuration of a plasma processing system.

In an embodiment, a plasma processing system includes a plasma processing apparatus 1 and a controller 2. The plasma processing system is an example of a substrate processing system, and the plasma processing apparatus 1 is an example of a substrate processing apparatus. The plasma processing apparatus 1 includes a plasma processing chamber 10, a substrate support 11, and a plasma generator 12. The plasma processing chamber 10 has a plasma processing space. Further, the plasma processing chamber 10 has at least one gas supply port for supplying at least one processing gas into the plasma processing space, and at least one gas exhaust port for exhausting the gas from the plasma processing space. The gas supply port is connected to a gas supply 20 which will be described later, and the gas exhaust port is connected to an exhaust system 40 which will be described later. The substrate support 11 is disposed in the plasma processing space and has a substrate support surface for supporting the substrate.

The plasma generator 12 is configured to generate plasma from at least one processing gas supplied into the plasma processing space. The plasma formed in the plasma processing space may be capacitively coupled plasma (CCP), inductively coupled plasma (ICP), electron-cyclotron-resonance plasma (ECR plasma), helicon wave-excited plasma (HWP), surface wave plasma (SWP), or the like. Further, various types of plasma generators, including an alternating current (AC) plasma generator and a direct current (DC) plasma generator, may be used. In one embodiment, an AC signal (AC power) used by the AC plasma generator has a frequency in a range of 100 kHz to 10 GHz. Accordingly, the AC signal includes a radio frequency (RF) signal and a microwave signal. In one embodiment, the RF signal has a frequency in a range of 100 kHz to 150 MHz.

The controller 2 processes computer-executable instructions for instructing the plasma processing apparatus 1 to execute various steps described herein below. The controller 2 may be configured to control the respective components of the plasma processing apparatus 1 to execute the various steps described herein below. In an embodiment, part or all of the controller 2 may be included in the plasma processing apparatus 1. The controller 2 may include a processor $2a1$, a storage unit $2a2$, and a communication interface $2a3$. The controller 2 is implemented by, for example, a computer $2a$. The processor $2a1$ may be configured to read a program from the storage unit $2a2$ and perform various control operations by executing the read program. The program may be stored in advance in the storage unit $2a2$, or may be acquired via a medium when necessary. The acquired program is stored in the storage unit $2a2$, and is read from the storage unit $2a2$ and executed by the processor $2a1$. The medium may be various storing media readable by the computer $2a$, or may be a communication line connected to the communication interface $2a3$. The processor $2a1$ may be a central processing unit (CPU). The storage $2a2$ may include a random access memory (RAM), a read only memory (ROM), a hard disk drive (HDD), a solid state drive (SSD), or a combination thereof. The communication interface $2a3$ may communicate with the plasma processing apparatus 1 via a communication line such as a local area network (LAN).

<Plasma Processing Apparatus>

Figure 2:
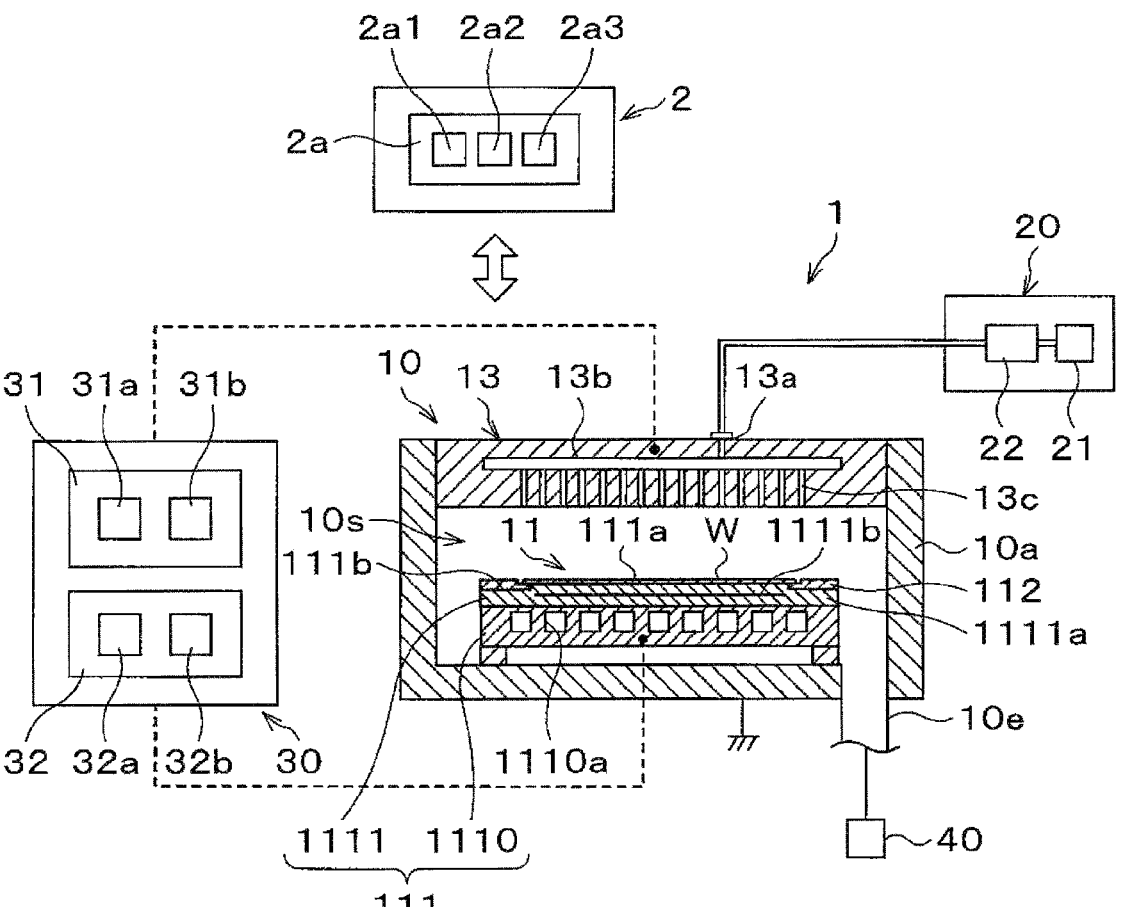
FIG. 2 is a view for explaining an example of a configuration of a capacitively-coupled plasma processing apparatus.

Hereinafter, a configuration example of a capacitively-coupled plasma processing apparatus as an example of the plasma processing apparatus 1 will be described. FIG. 2 is a view for explaining an example of a configuration of a capacitively-coupled plasma processing apparatus.

The capacitively-coupled plasma processing apparatus 1 includes a plasma processing chamber 10, a gas supply 20, a power source 30, and an exhaust system 40. Further, the plasma processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In one embodiment, the shower head 13 constitutes at least a part of a ceiling of the plasma processing chamber 10. The plasma processing chamber 10 has a plasma processing space $10s$ defined by the shower head 13, a sidewall $10a$ of the plasma processing chamber 10, and the substrate support 11. The plasma processing chamber 10 is grounded. The shower head 13 and the substrate support 11 are electrically insulated from a housing of the plasma processing chamber 10.

The substrate support 11 includes a main body 111 and a ring assembly 112. The main body 111 has a central region $111a$ for supporting the substrate W as a processing target, and an annular region $111b$ for supporting the ring assembly 112. The wafer is an example of the substrate W. The annular region $111b$ of the main body 111 surrounds the central region $111a$ of the main body 111 in a plan view. The substrate W is disposed on the central region $111a$ of the main body 111 and the ring assembly 112 is disposed on the annular region $111b$ of the main body 111 to surround the substrate W on the central region $111a$ of the main body 111. Accordingly, the central region $111a$ is also referred to as a substrate support surface for supporting the substrate W, and the annular region $111b$ is also referred to as a ring support surface for supporting the ring assembly 112.

In one embodiment, the main body 111 includes a base 1110 and an electrostatic chuck 1111. The base 1110 includes a conductive member. The conductive member of the base 1110 functions as a lower electrode. The electrostatic chuck 1111 is disposed on the base 1110. The electrostatic chuck 1111 includes a ceramic member $1111a$ and an electrostatic electrode $1111b$ disposed in the ceramic member $1111a$. The ceramic member $1111a$ has a central region $111a$. In one embodiment, the ceramic member $1111a$ also has an annular region $111b$. Other members that surround the electrostatic chuck 1111, such as an annular electrostatic chuck and an annular insulating member, may have the annular region $111b$. In this case, the ring assembly 112 may be disposed on the annular electrostatic chuck or the annular insulating member, or may be disposed on both the electrostatic chuck 1111 and the annular insulating member. Further, at least one RF/DC electrode coupled to the RF power source 31 and/or the DC power source 32 to be described later may be disposed in the ceramic member $1111a$. In this case, at least one RF/DC electrode functions as the lower electrode. In a case where the bias RF signal and/or the DC signal to be described later are supplied to at least one RF/DC electrode, the RF/DC electrode is also referred to as a bias electrode. The conductive member of the base 1110 and at least one RF/DC electrode may function as a plurality of lower electrodes. Further, the electrostatic electrode $1111b$ may function as the lower electrode. Accordingly, the substrate support 11 includes at least one lower electrode.

The ring assembly 112 includes one or more annular members. In one embodiment, one or more annular members include one or more edge rings and at least one cover ring. The edge ring is formed of a conductive material or an insulating material, and the cover ring is formed of an insulating material.

Further, the substrate support 11 may include a temperature control module configured to adjust at least one of the electrostatic chuck 1111, the ring assembly 112, and the substrate to a target temperature. The temperature control module may include a heater, a heat transfer medium, a flow path 1110a, or a combination thereof. A heat transfer fluid, such as brine or gas, flows through the flow path 1110a. In one embodiment, the flow path 1110a is formed inside the base 1110, and one or more heaters are disposed in the ceramic member 1111a of the electrostatic chuck 1111. Further, the substrate support 11 may include a heat transfer gas supply configured to supply a heat transfer gas to a gap between the rear surface of the substrate W and the central region 111a.

The shower head 13 is configured to introduce at least one processing gas from the gas supply 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. Further, the shower head 13 includes at least one upper electrode. The gas introduction unit may include, in addition to the shower head 13, one or a plurality of side gas injectors (SGI) that are attached to one or a plurality of openings formed in the sidewall 10a.

The gas supply 20 may include at least one gas source 21 and at least one flow rate controller 22. In one embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include at least one flow rate modulation device that modulates or pulses the flow rate of at least one processing gas.

The power source 30 includes an RF power source 31 coupled to plasma processing chamber 10 via at least one impedance matching circuit. The RF power source 31 is configured to supply at least one RF signal (RF power) to at least one lower electrode and/or at least one upper electrode. As a result, plasma is formed from at least one processing gas supplied into the plasma processing space 10s. Accordingly, the RF power source 31 may function as at least a part of the plasma generator 12. Further, supplying the bias RF signal to at least one lower electrode can generate a bias potential in the substrate W to attract an ionic component in the formed plasma to the substrate W.

In one embodiment, the RF power source 31 includes a first RF generator 31a and a second RF generator 31b. The first RF generator 31a is configured to be coupled to at least one lower electrode and/or at least one upper electrode via at least one impedance matching circuit to generate a source RF signal (source RF power) for plasma generation. In one embodiment, the source RF signal has a frequency in the range of 10 MHz to 150 MHz. In one embodiment, the first RF generator 31a may be configured to generate a plurality of source RF signals having different frequencies. The generated one or more source RF signals are supplied to at least one lower electrode and/or at least one upper electrode.

The second RF generator 31b is configured to be coupled to at least one lower electrode via at least one impedance matching circuit to generate the bias RF signal (bias RF power). A frequency of the bias RF signal may be the same as or different from a frequency of the source RF signal. In one embodiment, the bias RF signal has a lower frequency than the frequency of the source RF signal. In one embodiment, the bias RF signal has a frequency in the range of 100 kHz to 60 MHz. In one embodiment, the second RF generator 31b may be configured to generate a plurality of bias RF signals having different frequencies. The generated one or more bias RF signals are supplied to at least one lower electrode. Further, in various embodiments, at least one of the source RF signal and the bias RF signal may be pulsed.

Further, the power source 30 may include a DC power source 32 coupled to the plasma processing chamber 10. The DC power source 32 includes a first DC generator 32a and a second DC generator 32b. In one embodiment, the first DC generator 32a is configured to be connected to at least one lower electrode to generate the first DC signal. The generated first DC signal is applied to at least one lower electrode. In one embodiment, the second DC generator 32b is configured to be connected to at least one upper electrode to generate a second DC signal. The generated second DC signal is applied to at least one upper electrode.

In various embodiments, the first and second DC signals may be pulsed. In this case, the sequence of voltage pulses is applied to at least one lower electrode and/or at least one upper electrode. The voltage pulse may have a pulse waveform of a rectangle, a trapezoid, a triangle or a combination thereof. In one embodiment, a waveform generator for generating a sequence of voltage pulses from the DC signal is connected between the first DC generator 32a and at least one lower electrode. Accordingly, the first DC generator 32a and the waveform generator configure a voltage pulse generator. In a case where the second DC generator 32b and the waveform generator configure the voltage pulse generator, the voltage pulse generator is connected to at least one upper electrode. The voltage pulse may have a positive polarity or a negative polarity. Further, the sequence of the voltage pulses may include one or more positive voltage pulses and one or more negative voltage pulses in one cycle. The first and second DC generators 32a and 32b may be provided in addition to the RF power source 31, and the first DC generator 32a may be provided instead of the second RF generator 31b.

The exhaust system 40 may be connected to, for example, a gas exhaust port 10e disposed at a bottom portion of the plasma processing chamber 10. The exhaust system 40 may include a pressure adjusting valve and a vacuum pump. The pressure in the plasma processing space 10s is adjusted by the pressure adjusting valve. The vacuum pump may include a turbo molecular pump, a dry pump, or a combination thereof.

First Embodiment of Plasma Processing Method

Figure 3:
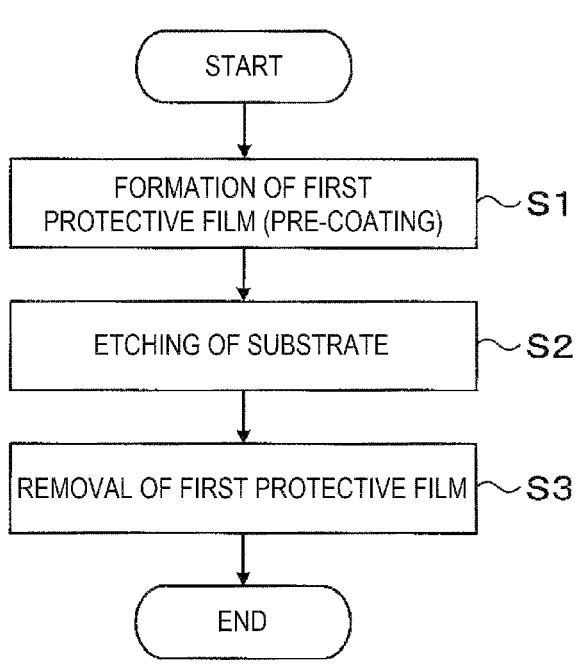
FIG. 3 is a flowchart illustrating main steps of plasma processing according to a first embodiment.

Next, a first embodiment of the plasma processing method will be described. In the first embodiment, a case of performing etching as the plasma processing will be described. FIG. 3 is a flowchart illustrating main steps of plasma processing according to a first embodiment.

[Step S1]

First, a so-called pre-coating is performed in which a first protective film is formed on the surface of the inner member (hereinafter, may be referred to as a "chamber inner member") of the plasma processing chamber 10 by a plasma of the first processing gas (step S1 in FIG. 3). The chamber inner member includes at least a member exposed to the plasma processing space 10s, and also includes the plasma processing chamber 10. Further, the chamber inner member includes a member made of, for example, S1 or quartz. The first processing gas includes a precursor gas that does not contain halogen. The precursor gas is a hydrocarbon ($C_xH_y$: x and y are integers) gas, and is, for example, $CH_4$, $C_2H_6$, $C_2H_4$, $C_3H_8$, $C_3H_6$, or the like. The first processing gas may further contain a rare gas. The rare gas is, for example, Ar, He, or the like.

In step S1, first, a substrate (hereinafter referred to as a "dummy substrate") different from the processing target is carried in into the plasma processing chamber 10, and the dummy substrate is placed on the electrostatic chuck 1111. Further, after the dummy substrate is carried in, the pressure inside the plasma processing chamber 10 is reduced to a desired vacuum level by the exhaust system 40.

Subsequently, the first processing gas is supplied from the gas supply 20 to the plasma processing space 10s via the shower head 13. Further, the first RF generator 31a of the RF power source 31 supplies the source RF power for plasma generation to the conductive member of the substrate support 11 and/or the conductive member of the shower head 13. The first processing gas is excited to generate plasma. Then, the first protective film is formed on the surface of the chamber inner member by the action of the generated plasma. After the first protective film is formed, the dummy substrate is carried out from the plasma processing chamber 10.

[Step S2]

Next, the substrate W that is a processing target is etched by the plasma of the second processing gas (step S2 in FIG. 3). The second processing gas includes at least a hydrogen-containing gas. The hydrogen-containing gas is, for example, HBr, $CH_2F_2$, $H_2$, or the like. Further, the second processing gas may contain a fluorocarbon gas, a hydrofluorocarbon gas, or a halogen-containing gas. The fluorocarbon gas is, for example, a $C_4F_6$ gas, a $C_4F_8$ gas, or the like, the hydrofluorocarbon gas is, for example, $CHF_3$, $CH_2F_2$, or the like, and the halogen-containing gas is, for example, $Cl_2$, $SiCl_4$, or the like. Further, the second processing gas may include a metal-containing gas such as $WF_6$. Further, the second processing gas may include a rare gas, an oxygen-containing gas, and a nitrogen-containing gas. The rare gas is, for example, Ar, He, or the like, the oxygen-containing gas is, for example, $O_2$ or the like, and the nitrogen-containing gas is, for example, $N_2$ or the like. These second processing gases are selected according to the shape of the etching target film included in the substrate W or the etching target film after the desired etching.

In step S2, first, the substrate W that is the processing target is carried in into the plasma processing chamber 10, and the substrate W is placed on the electrostatic chuck 1111. The substrate W is electrostatically adsorbed and held by the electrostatic chuck 114 by a Coulomb force. At this time, the substrate W is adjusted to a desired temperature. Further, after the substrate W is carried in, the pressure inside the plasma processing chamber 10 is reduced to a desired vacuum level by the exhaust system 40.

Subsequently, the second processing gas is supplied from the gas supply 20 to the plasma processing space 10s via the shower head 13. Further, the first RF generator 31a of the RF power source 31 supplies the source RF power for plasma generation to the conductive member of the substrate support 11 and/or the conductive member of the shower head 13. The second processing gas is excited to generate plasma. At this time, the second RF generator 31b may supply a bias RF signal for attracting ions. Then, the substrate W is etched by the action of the generated plasma. After the etching of the substrate W, the substrate W is carried out from the plasma processing chamber 10.

The substrate W etched in step S2 may be one substrate or a plurality of substrates. In the case of the plurality of substrates, after the etched substrate W is carried out from the plasma processing chamber 10, another substrate W is carried in inside the plasma processing chamber 10 and etched.

[Step S3]

Next, the first protective film is removed from the surface of the chamber inner member by a plasma of a third processing gas that includes a gas from which the first protective film can be removed (step S3 in FIG. 3). The gas from which the first protective film can be removed is the oxygen-containing gas. The oxygen-containing gas is, for example, $O_2$ or the like.

In step S3, first, the dummy substrate is carried in into the plasma processing chamber 10, and the dummy substrate is placed on the electrostatic chuck 1111. Further, after the dummy substrate is carried in, the pressure inside the plasma processing chamber 10 is reduced to a desired vacuum level by the exhaust system 40.

Subsequently, the third processing gas is supplied from the gas supply 20 to the plasma processing space 10s via the shower head 13. Further, the first RF generator 31a of the RF power source 31 supplies the source RF power for plasma generation to the conductive member of the substrate support 11 and/or the conductive member of the shower head 13. The third processing gas is excited to generate plasma. At this time, the second RF generator 31b may supply a bias RF signal for attracting ions. Then, the first protective film is removed from the surface of the chamber inner member by the action of the generated plasma. After the first protective film is removed, the dummy substrate is carried out from the plasma processing chamber 10.

Further, after the dummy substrate is carried out from the plasma processing chamber 10, the surface of the chamber inner member and the surface of the electrostatic chuck 1111 may be cleaned by the plasma of the third processing gas. At the same time, the charges on the surface of the electrostatic chuck 1111 may also be destaticized.

Further, after the first protective film is removed, while the dummy substrate is separated from the surface of the electrostatic chuck 1111 before being carried out from the plasma processing chamber 10, the plasma of the third process gas may be used to clean the surfaces of the chamber inner members and the surface of the electrostatic chuck 1111 and to destaticize the charges on the surface of the electrostatic chuck 1111. At this time, sufficient plasma is also generated between the dummy substrate and the surface of the electrostatic chuck 1111, so that the distance separating the dummy substrate from the surface of the electrostatic chuck 1111 may be greater than a width of the sheath formed by the plasma of the third processing gas, and may be about 8 mm or more.

In the first embodiment, steps S1 to S3 are repeatedly performed, and plasma processing is continuously performed on the substrate W.

Further, when steps S1 to S3 are repeated, the dummy substrate in step S1 and the dummy substrate in step S3 may be the same. In this case, it is possible to omit the carry-out of the dummy substrate after step S3 and the carry-in of the dummy substrate at the start of step S1, thereby shortening the time accordingly.

According to the first embodiment described above, in step S1, the first protective film is formed on the surface of the chamber inner member by the plasma of the first processing gas that includes the precursor gas that does not contain halogen. Therefore, the etching in step S2 is stabilized, and for example, a temporal change of the etching rate can be suppressed. Further, even if the first protective film is removed in step S3, damage to the chamber inner member can be suppressed. Hereinafter, these effects will be described in detail.

The present inventors have performed etching of the substrate W in a case of performing pre-coating of different film types, and examined the temporal change of the etching rate. Comparative Example 1 is an example in which the protective film is formed on the surface of the chamber inner member by a plasma of the $C_4F_8$ gas. Comparative Example 2 is an example in which the protective film is formed on the surface of the chamber inner member by a plasma of a mixed gas of the $CH_4$ gas and the $C_4F_8$ gas. The example is an example of the present embodiment, in which the first protective film is formed on the surfaces of the chamber inner members by a plasma of the $CH_4$ gas.

Comparative Example 1 will be described. In the present test, the temporal change of the etching rate in a case where the protective film by the $C_4F_8$ monogas of Comparative Example 1 was pre-coated and the temporal change of the etching rate in a case where no pre-coating was provided were compared. As a result, the etching rate rose over time in both the case where the pre-coating of Comparative Example 1 was provided and the case where no pre-coating was provided. Further, the temporal change of the etching rate in the case of the pre-coating of Comparative Example 1 was larger than the temporal change of the etching rate in a case of no pre-coating. For example, in the case of no pre-coating, a temporal change rate of the etching rate was 1.4%. Meanwhile, in the case of the pre-coating of Comparative Example 1, the temporal change rate of the etching rate was 2.7%. Therefore, it was found that in a case where the protective film by the $C_4F_8$ monogas of Comparative Example 1 was pre-coated, the etching was not stabilized. The temporal change rate of the etching rate refers to a rate of change of the etching rate after the etching, that is, after the supply of the source RF power is performed for a predetermined time (10 h) with respect to the etching rate of the initial (0 h).

Comparative Example 2 will be described. In the present test, the temporal change of the etching rate in a case where the protective film by the mixed gas of the $CH_4$ gas and the $C_4F_8$ gas of Comparative Example 2 was pre-coated and the temporal change of the etching rate in a case where no pre-coating was provided were compared. As a result, the etching rate rose over time in both the case where the pre-coating of Comparative Example 2 was provided and the case where no pre-coating was provided. However, the temporal change of the etching rate in the case where the pre-coating of Comparative Example 2 was provided was about half the temporal change of the etching rate with no pre-coating. For example, in the case of no pre-coating, the temporal change rate of the etching rate was 6.3%. Meanwhile, in the case of the pre-coating of Comparative Example 2, the temporal change rate of the etching rate was 3.7%. Therefore, it was found that in a case where the protective film by the mixed gas of the $CH_4$ gas and the $C_4F_8$ gas of Comparative Example 2 was pre-coated, the temporal change of the etching rate was improved, but the etching was not stabilized, as compared with Comparative Example 1 described above.

Examples will be described. In the present test, the temporal change of the etching rate in a case where the protective film by the $CH_4$ gas monogas of the example was pre-coated and the temporal change of the etching rate in a case where no pre-coating was provided were compared. As a result, the etching rate rose over time in the case where the no pre-coating was provided, whereas the etching rate did not substantially vary over time in the case where the pre-coating of the example was provided. For example, in the case of no pre-coating, the temporal change rate of the etching rate was 2.6%. Meanwhile, in the case of the pre-coating of the example, the temporal change rate of the etching rate was 0.06%. Therefore, it was found that in a case where the protective film by the $CH_4$ gas monogas of the example was pre-coated, the temporal change of the etching rate was suppressed, and the etching was stabilized.

Based on the test results described above, in a case where the protective film by the $CH_4$ gas monogas of the example is pre-coated, the temporal change of the etching rate can also be suppressed. Further, as a result of intensive studies by the present inventors, the following has been found: in a case where the first protective film by the first processing gas that includes the precursor gas that does not contain halogen is pre-coated, the temporal change of the etching rate is suppressed and the etching is stabilized, similarly to the $CH_4$ gas.

As described above, the temporal change of the etching rate can be reduced in the order of example ($CH_4$ monogas), Comparative Example 2 (mixed gas of the $CH_4$ gas and the $C_4F_8$ gas), and Comparative Example 1 ($C_4F_8$ monogas). The present inventors have inferred this mechanism as follows.

Figure 4:
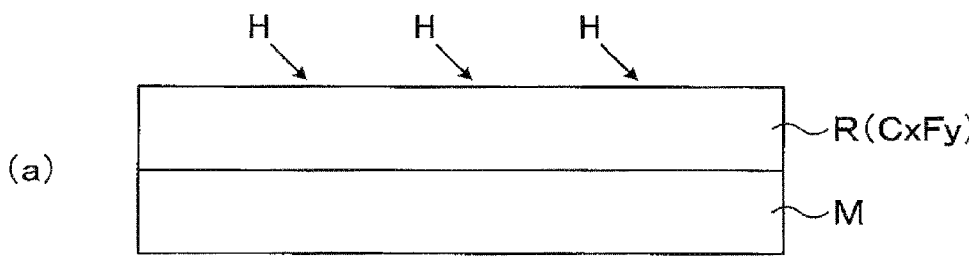
FIG. 4 is a view for explaining a surface state of a member of a chamber inner member in Comparative Examples 1 and 2 of the first embodiment.
Figure 4:
Figure 4:
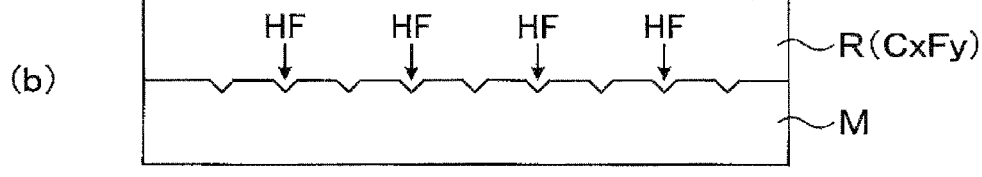

As illustrated in part (a) of FIG. 4, for example, in a case where the protective films R of Comparative Examples 1 and 2 include F, the protective film R is exposed to H in the hydrogen-containing gas of the second processing gas used in the etching. Then, as illustrated in part (b) of FIGS. 4, F and H react with each other to generate HF inside the protective film R, and this HF reacts with the chamber inner member M, so that the surface of the chamber inner member M is damaged (consumed) and surface roughness occurs. The chamber inner member M is made of, for example, Si or quartz. Then, the damage to the chamber inner member M affects the etching, and the etching rate changes over time.

Figure 5:
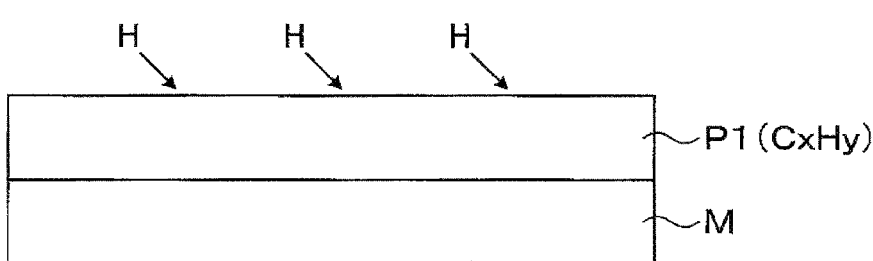
FIG. 5 is a view for explaining the surface state of the chamber inner member in an example of the first embodiment.

On the other hand, as illustrated in FIG. 5, for example, in a case where the first protective film P1 of the example does not contain F (halogen), the first protective film P1 does not react with H of the second processing gas, so that damage to the surface of the chamber inner member M can be suppressed. As a result, it is possible to suppress that the etching rate is changed over time, and it is possible to stabilize the etching.

Even when the hydrogen-containing gas is not included in the second processing gas, it is also expected that the surface of the chamber inner member M is damaged (consumed) by the reaction between the surface of the chamber inner member M and F included in the protective film R due to thermal energy or energy of ions irradiated from plasma at an interface between the chamber inner member M and the protective film R, so that surface roughness occurs. The thermal energy is obtained in a case where the chamber inner member M is controlled to a constant temperature by a heating mechanism (not described) or is heated by UV light from plasma, or the energy of ions irradiated from plasma is converted into heat. On the other hand, for example, in a case where the first protective film P1 of the example does not include F (halogen), damage to the surface of the chamber inner member M can be suppressed.

Second Embodiment of the Plasma Processing Method

Figure 6:
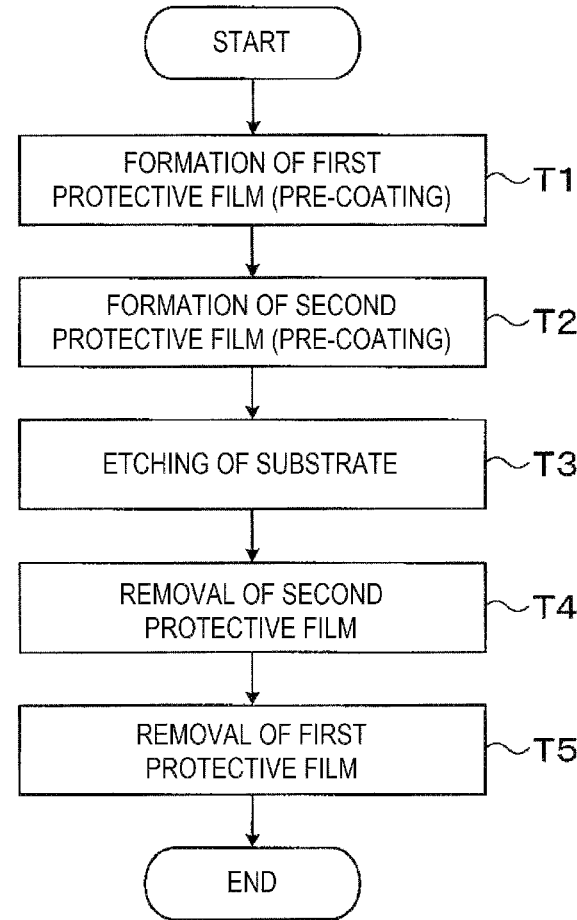
FIG. 6 is a flowchart illustrating main steps of plasma processing according to a second embodiment.

Next, a second embodiment of the plasma processing method will be described. In the first embodiment described above, the first protective film, that is, the monolayer is pre-coated, but in the second embodiment, the protective film of a plurality of layers is pre-coated. Similar to the first embodiment, the second embodiment will also be described with respect to a case where etching is performed as plasma processing. FIG. 6 is a flowchart illustrating main steps of plasma processing according to a second embodiment.

[Step T1]

First, a so-called pre-coating is performed in which the first protective film is formed on the surface of the chamber inner member by the plasma of the first processing gas (step T1 in FIG. 6). The first processing gas includes a precursor gas that does not contain halogen. The precursor gas is a hydrocarbon ($C_xH_y$: x and y are integers) gas, and is, for example, $CH_4$, $C_2H_6$, $C_2H_4$, $C_3H_8$, $C_3H_6$, or the like. The first processing gas may further include a rare gas. The rare gas is, for example, Ar, He, or the like. Since the details of step T1 are the same as those of step S1 of the first embodiment, descriptions thereof will be omitted.

[Step T2]

Figure 7:
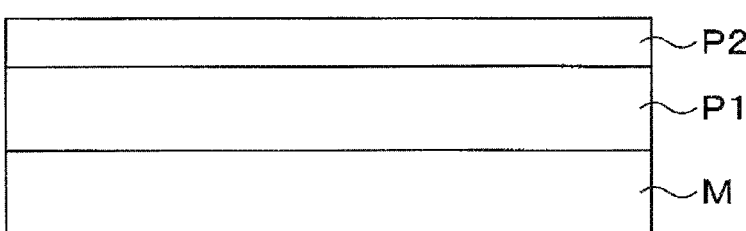
FIG. 7 is a view for explaining a state where a first protective film and a second protective film are pre-coated in the second embodiment.

Next, so-called pre-coating is performed, in which the second protective film P2 is formed on the first protective film P1 as illustrated in FIG. 7, by a plasma of a fourth processing gas of the same type as the second processing gas used in step T3 to be described later (step T2 in FIG. 6). The fourth processing gas includes the same precursor gas as the second processing gas. The fourth processing gas may include, for example, any or plurality of H, F, N, and C. Further, the fourth processing gas may include a metal-containing gas.

In step T2, the processing is continued from step T1 in a state where the dummy substrate is placed on the electrostatic chuck 1111. Then, the processing gas supplied from the gas supply 20 to the plasma processing space 10s via the shower head 13 is switched from the first processing gas to the fourth processing gas. Further, the first RF generator 31a of the RF power source 31 supplies the source RF power for plasma generation to the conductive member of the substrate support 11 and/or the conductive member of the shower head 13. The fourth processing gas is excited to generate plasma. At this time, the second RF generator 31b may supply a bias RF signal for attracting ions. Then, the second protective film P2 is formed on the first protective film P1 by the action of the generated plasma. After the second protective film P2 is formed, the dummy substrate is carried out from the plasma processing chamber 10.

The process conditions in step T2 are preferably the same as the process conditions in step T3 to be described later. For example, in a case where step T3 includes a plurality of different process conditions, and the process conditions A, B, and C are sequentially performed to etch the substrate W, the process conditions in step T2 are preferably the same as the initial process conditions A in step T3.

In this case, when the etching is performed in step T3, a by-product (by-generative product) is generated by the etching, and the same by-product is generated from the second protective film P2. When the same by-product as that during the etching is performed from the second protective film P2 is generated, the process condition of step T2 need not be exactly the same as the initial process condition A of step T3. As the priority order of the condition setting, for example, the following order of (1) to (3) below may be considered.

(1) The type of the fourth processing gas in step T2 is the same as the type of the second processing gas in step T3.

(2) The flow rate of the fourth processing gas in step T2 is the same as the flow rate of the second processing gas in step T3.

(3) The RF power and the processing pressure in step T2 are the same as the RF power and the processing pressure in step T3, respectively.

[Step T3]

Next, the substrate W that is the processing target is etched by the plasma of the second processing gas (step T3 in FIG. 6). Further, one substrate W may be etched, or a plurality of substrates W may be etched. The details of step T3 are the same as those of step S2 of the first embodiment, and thus descriptions thereof will be omitted.

[Step T4]

Next, the second protective film P2 is removed from the first protective film P1 by a plasma of a fifth processing gas that includes the gas capable of removing the second protective film P2 (step T4 in FIG. 6). The gas capable of removing the second protective film P2 is appropriately selected according to the second protective film P2. For example, if the main component of the second protective film P2 is an organic film such as fluorocarbon, the gas (fifth processing gas) capable of removing the second protective film P2 is an oxygen-containing gas. The oxygen-containing gas is, for example, $O_2$ or the like. Further, in a case where the second protective film P2 contains a metal, the fifth processing gas may include a halogen-containing gas. The halogen-containing gas is, for example, the $CF_4$ gas, the $Cl_2$ gas, or the like.

In step T4, first, the dummy substrate is carried in into the plasma processing chamber 10, and the dummy substrate is placed on the electrostatic chuck 1111. Further, after the dummy substrate is carried in, the pressure inside the plasma processing chamber 10 is reduced to a desired vacuum level by the exhaust system 40.

Subsequently, the fifth processing gas is supplied from the gas supply 20 to the plasma processing space 10s via the shower head 13. Further, the first RF generator 31a of the RF power source 31 supplies the source RF power for plasma generation to the conductive member of the substrate support 11 and/or the conductive member of the shower head 13. The fifth processing gas is excited to generate plasma. At this time, the second RF generator 31b may supply a bias RF signal for attracting ions. Then, the second protective film P2 is removed from the first protective film P1 by the action of the generated plasma.

[Step T5]

Next, the first protective film P1 is removed from the surface of the chamber inner member M by the plasma of the third processing gas that includes the gas capable of removing the first protective film P1 (step T5 in FIG. 6). The gas capable of removing the first protective film P1 is the oxygen-containing gas. The oxygen-containing gas is, for example, $O_2$ or the like. The details of step T5 are the same as those of step S3 of the first embodiment, and thus descriptions thereof will be omitted.

In a case where the fifth processing gas of step T4 and the third processing gas of step T5 are the same, it is not necessary to separate step T4 and step T5, and the removal of the second protective film P2 and the removal of the first protective film P1 may be consecutively performed.

Further, after the second protective film P2 and the first protective film are removed, the dummy substrate is carried out from the plasma processing chamber.

Further, after the dummy substrate is carried out from the plasma processing chamber 10, the surface of the chamber inner member and the surface of the electrostatic chuck 1111 may be cleaned by the plasma of the third process gas. At the same time, the charges on the surface of the electrostatic chuck 1111 may also be destaticized.

Further, after the first protective film is removed, while the dummy substrate is separated from the surface of the electrostatic chuck 1111 before being carried out from the plasma processing chamber 10, the plasma of the third process gas may be used to clean the surfaces of the chamber inner members and the surface of the electrostatic chuck 1111 and to destaticize the charges on the surface of the electrostatic chuck 1111. At this time, sufficient plasma is also generated between the dummy substrate and the surface of the electrostatic chuck 1111, so that the distance separating the dummy substrate from the surface of the electrostatic chuck 1111 may be greater than a width of the sheath formed by the plasma of the third processing gas, and may be about 8 mm or more.

In the second embodiment, steps T1 to T5 are repeatedly performed, and plasma processing is continuously performed on the substrate W.

Further, when steps T1 to T5 are repeated, the dummy substrate in step T1 and the dummy substrate in step T4 and step T5 may be the same. In this case, it is possible to omit the carry-out of the dummy substrate after step T5 and the carry-in of the dummy substrate at the start of step T1, thereby shortening the time accordingly.

The second embodiment described above can also have the same effects as those of the first embodiment. That is, since the first protective film P1 is formed on the surface of the chamber inner member M by the plasma of the first processing gas that includes the precursor gas that does not contain halogen in step T1, the etching in step T3 can be stabilized, and for example, the temporal change of the etching rate can be suppressed. Further, even if the first protective film P1 is removed in step T5, the damage to the chamber inner member M can be suppressed.

Further, in the second embodiment, at least the type of the fourth processing gas of step T2 is the same as the type of the second processing gas of step T3, and preferably, the process conditions of step T2 are the same as the initial process conditions A of step T3. Therefore, in step T3, the same by-product as that during the etching can be generated from the second protective film P2. As a result, it is possible to further stabilize the etching in step T3. For example, in a case of etching a plurality of substrates W in step T3, the etching rate becomes constant from the first substrate. Further, in-plane uniformity of the etching rate may be improved. Further, it is also possible to reduce the rate of change of the etching rate after the etching, that is, the supply of the source RF power, is performed for a predetermined time.

In a case where the process condition D, the process condition E, and the process condition F are sequentially performed in the second step T3 to etch the substrate W, the process condition of the second step T2 is preferably the same as the initial process condition D of step T3. That is, the process condition of step T2 is preferably the same as the initial process condition of step T3 that is performed immediately after step T2.

Further, in the second embodiment, in the example described above, the two layers of the first protective film P1 and the second protective film P2 are pre-coated, but three or more layers may be pre-coated. In this case, the lower layer on the chamber inner member M side may be the first protective film P1, and the upper layer on the plasma processing space 10s side may be the second protective film P2. Further, the plurality of layers of the pre-coating may vary in a height direction as in a gradient, and even in this case, the lower layer may be the first protective film P1, and the upper layer may be the second protective film P2.

<Film Thickness of First Protective Film>

Next, the film thickness of the first protective film P1 will be described. In step T4, so-called ion sputtering is performed by the plasma of the fifth processing gas to remove the second protective film P2. In this case, as illustrated in FIGS. 8A to 8C, the second protective film P2 and the first protective film P1 are irradiated with ions generated by the plasma of the fifth processing gas (the third processing gas).

Figure 8A:
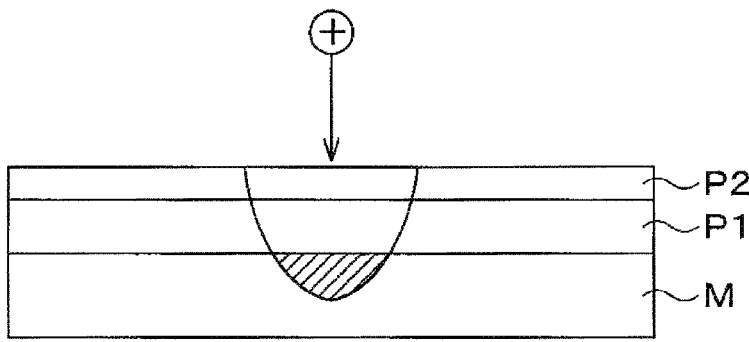
FIG. 8A is a view for explaining the film thickness of the first protective film in the second embodiment.

As illustrated in FIG. 8A, in a case where the energy of the ions (hereinafter referred to as "ion energy") is large, that is, in a case where a curved region in FIG. 8A is large, the ion energy reaches the inside (hatched region in FIG. 8A) of the chamber inner member M. For example, in a case where the second protective film P2 includes F and the chamber inner member M is formed of S1, S1 and F react with each other inside the surface layer of the chamber inner member M, so that a $SiF_4$ is generated and the $SiF_4$ is further evaporated. As a result, the etching is accelerated. Then, since the $SiF_4$ is evaporated or does not evaporate inside the surface of the chamber inner member M, the surface of the chamber inner member M is consumed, and the surface roughness occurs.

Figure 8B:
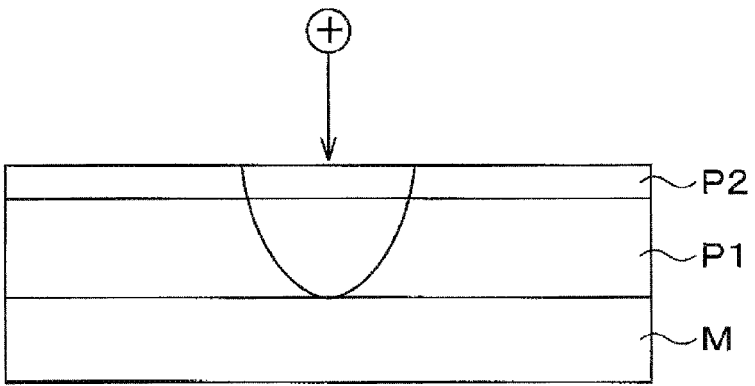
FIG. 8B is a view for explaining a film thickness of the first protective film in the second embodiment.

Further, as illustrated in FIG. 8B, even in a case where the ion energy reaches the surface of the chamber inner member M, since the $SiF_4$ evaporates or does not evaporate inside the surface of the chamber inner member M, the surface of the chamber inner member M is roughened.

Figure 8C:
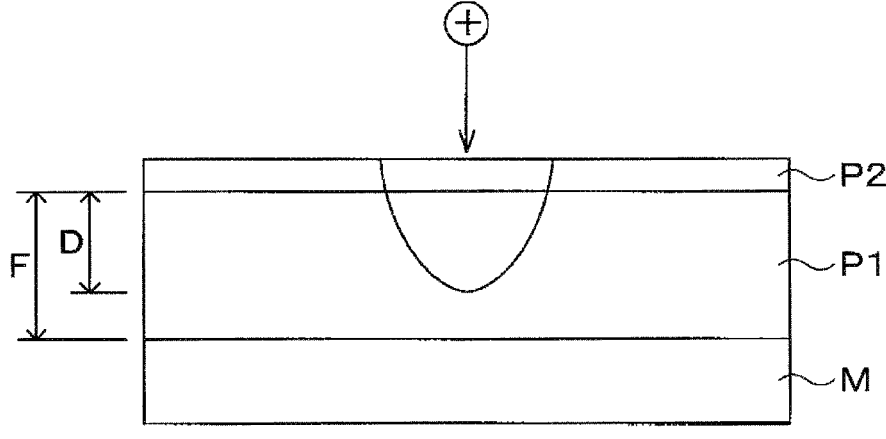
FIG. 8C is a view for explaining a film thickness of the first protective film in the second embodiment.

On the other hand, as illustrated in FIG. 8C, in a case where the ion energy does not reach the surface of the chamber inner member M, the $SiF_4$ does not evaporate, and the surface of the chamber inner member M is not roughened. Therefore, it is preferable that the film thickness F of the first protective film P1 be thicker than the depth D to which the ions penetrate the first protective film P1 when the second protective film P2 and the first protective film P1 are irradiated with the ions in step T4. In this case, it is possible to suppress the surface roughness of the chamber inner member M.

Figure 9A:
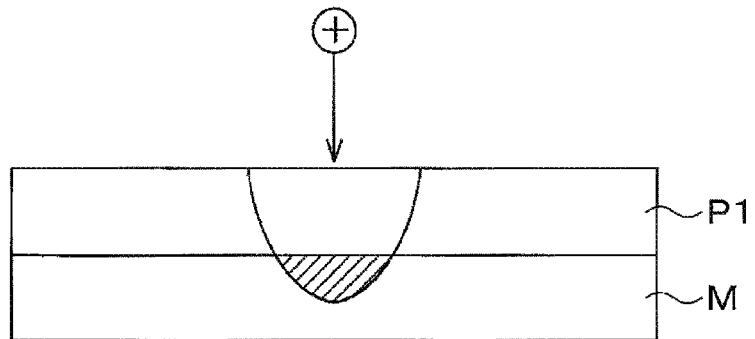
FIG. 9A is a view for explaining the film thickness of the first protective film in the first embodiment.

In the case of the first embodiment, only the first protective film P1 is pre-coated. Therefore, as illustrated in FIG. 9A, the ion energy (curved region in FIG. 9A) is large, and even if the ion energy reaches the inside of the surface layer of the chamber inner member M (hatched region in FIG. 9A), the surface of the chamber inner member M does not easily react. However, the third processing gas used in step S3 may include F, and there is a concern that F of the third processing gas reaches the inside of the surface layer of the chamber inner member M. In this case, as in the case of FIGS. 8A, Si and F react with each other to evaporate the $SiF_4$, so that the surface of the chamber inner member M may be roughened.

Figure 9B:
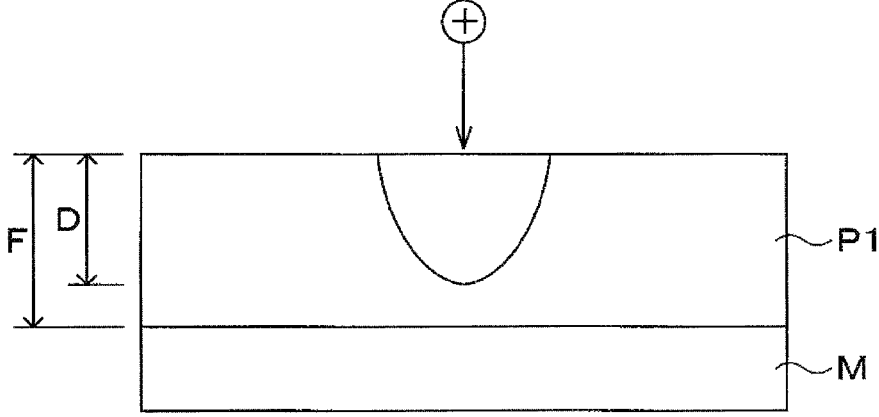
FIG. 9B is a view for explaining the film thickness of the first protective film in the first embodiment.

Therefore, also in the first embodiment, as illustrated in FIG. 9B, the film thickness F of the first protective film P1 is preferably thicker than the depth D to which the ions penetrate the first protective film P1 when the first protective film P1 is irradiated with the ions in step S3. In this case, it is possible to suppress the surface roughness of the chamber inner member M.

Other Embodiments

In the first embodiment and the second embodiment described above, the first protective film is an organic film, and the precursor gas of the first processing gas is hydrocarbon, but the first protective film and the precursor gas are not limited thereto. For example, in a case where the first protective film is the oxide film ($SiO_2$ film), the precursor gas of the first processing gas may be the silicon-containing gas without containing halogen. The silicon-containing gas is an aminosilane-based gas, a silicon alkoxide-based gas, or the like. The aminosilane-based gas is, for example, bistertiarybutylaminosilane (BTBAS), bisdimethylaminosilane (BDMAS), bisdiethylaminosilane (BDEAS), dimethylaminosilane (DMAS), diethylaminosilane (DEAS), dipropylaminosilane (DPAS), butylaminosilane (BAS), bisethylmethylaminosilane (BEMAS), tridimethylaminosilane (TDMAS), hexamethyldisilazane (HDMS), dimethylsilyldimethylamine (DMSDMA), dimethilaminotrimethylsilane (TMSDMA), trimethylmethylaminosilane (TMMAS), trimethyl (isocyanato) silane (TMICS), trimethylsilylacetylene (TMSA), trimethylsilylcyanide (TMSC), or the like. The silicon alkoxide-based gas is, for example, tetraethoxysilane (TEOS). Further, the silicon-containing gas may be 4 dimethylaminosilane (4DMAS), diisopropylaminosilane (DIPAS), or the like as the S1 source gas.

Further, when the first protective film is formed in steps S1 and T1, plasma chemical vapor deposition (CVD) is used, but the film formation method of the silicon-containing film is arbitrary. In a case of forming the first protective film using the aminosilane-based gas, plasma CVD or atomic layer deposition (ALD) may be used. In a case of the plasma CVD, the oxygen-containing gas such as the $O_2$ gas is used as the additive gas. In a case of the ALD, a step of using the aminosilane-based gas and a step of using the oxygen-containing gas plasma such as the $O_2$ gas are repeated. In the step of using the aminosilane-based gas, plasma of the aminosilane-based gas may be used, or a heat adsorption reaction with respect to the chamber inner member may be used without using the plasma. Further, in a case of forming the first protective film by using the silicon alkoxide-based gas, the plasma CVD may be used. In such a case, the oxygen-containing gas such as the $O_2$ gas is used as the additive gas.

In a case where the precursor gas of the first processing gas is the silicon-containing gas, the gas capable of removing the first protective film in steps S3 and T5 is the halogen-containing gas.

In the first embodiment and the second embodiment described above, etching is performed as the plasma processing, but the present disclosure is not limited thereto. For example, the technique of the present disclosure can also be applied to the case of performing the film formation processing in steps S2 and T3.

The following configuration examples also belong to the technical scope of the present disclosure.

(1) A plasma processing method including:
(a) forming a first protective film on a surface of an inner member of a chamber by a first processing gas including a precursor gas that does not contain halogen; and
(b) performing plasma processing on a processing target that is carried in inside the chamber by a plasma of a second processing gas after the first protective film is formed on the surface of the member.

(2) The plasma processing method described in (1), further including (c) removing the first protective film from the surface of the member by a plasma of a third processing gas that includes a gas capable of removing the first protective film after the processing target subjected to the plasma processing is carried out to an outside of the chamber.

(3) The plasma processing method described in (2), wherein a film thickness of the first protective film formed in (a) is thicker than a depth to which ions generated by the plasma penetrate the first protective film when the first protective film is irradiated with the ions in (c).

(4) The plasma processing method described in (2) or (3), wherein the precursor gas is a hydrocarbon gas, and the gas capable of removing the first protective film is an oxygen-containing gas.

(5) The plasma processing method described in (2) or (3), wherein the precursor gas is a silicon-containing gas, and the gas capable of removing the first protective film is a halogen-containing gas.

(6) The plasma processing method described in any one of (1) to (5), further including (d) forming a second protective film on the first protective film by a plasma of a fourth processing gas of the same type as that of the second processing gas, after (a) and before (b).

(7) The plasma processing method described in (6), wherein a process condition in (d) is the same as an initial process condition in (b).

(8) A plasma processing system including:
a chamber for performing plasma processing on a processing target;
a gas supply that supplies a processing gas to an inside of the chamber;
a plasma generator that generates plasma from the processing gas in the inside of the chamber; and
a controller configured to control the gas supply and the plasma generator to execute
(a) forming a first protective film on a surface of an inner member of a chamber by a first processing gas including a precursor gas that does not contain halogen, and
(b) performing plasma processing on a processing target that is carried in inside the chamber by a plasma of a second processing gas after the first protective film is formed on the surface of the member.

(9) The plasma processing system described in (8), wherein the controller is configured to control the gas supply and the plasma generator to execute (c) removing the first protective film from the surface of the member by a plasma of a third processing gas that includes a gas capable of removing the first protective film after the processing target subjected to the plasma processing is carried out to an outside of the chamber.

(10) The plasma processing system described in (9), wherein the controller is configured to control the gas supply and the plasma generator such that a film thickness of the first protective film formed in (a) is thicker than a depth to which ions generated by the plasma penetrate the first protective film when the first protective film is irradiated with the ions in (c).

(11) The plasma processing system described in (9) or (10), wherein the precursor gas is a hydrocarbon gas, and the gas capable of removing the first protective film is an oxygen-containing gas.

(12) The plasma processing system described in (9) or (10), wherein the precursor gas is a silicon-containing gas, and the gas capable of removing the first protective film is a halogen-containing gas.

(13) The plasma processing system described in any one of (8) to (12), wherein the controller is configured to control the gas supply and the plasma generator to execute (d) forming a second protective film on the first protective film by a plasma of a fourth processing gas of the same type as that of the second processing gas, after (a) and before (b).

(14) The plasma processing system described in (13), wherein the controller controls a process condition in (d) to be the same as an initial process condition in (b).

According to the present disclosure, pre-coating can be appropriately performed on the surface of the inner member of the chamber before the plasma processing.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A plasma processing method comprising:

forming a first protective film on a surface of an inner member of a chamber by a first processing gas including a precursor gas that does not contain halogen; then forming a second protective film on the first protective film by a plasma of a fourth processing gas; then performing plasma processing on a processing target that is carried in inside the chamber by a plasma of a second processing gas that is of the same type as that of the fourth processing gas; then removing the second protective film by plasma of a fifth processing gas; and then removing the first protective film from the surface of the member by a plasma of a third processing gas, wherein a film thickness of the first protective film is thicker than a depth to which ions generated by the plasma of the third processing gas penetrate the first protective film when the first protective film is irradiated with the ions generated by the plasma of the third processing gas to remove the first protective film.

2. The plasma processing method according to claim 1, wherein the precursor gas is a hydrocarbon gas, and the third processing gas is an oxygen-containing gas.

3. The plasma processing method according to claim 1, wherein the precursor gas is a silicon-containing gas, and the third processing gas is a halogen-containing gas.

4. The plasma processing method according to claim 1, wherein a process condition during forming the second protective film is the same as an initial process condition in the performing the plasma processing.

5. The plasma processing method according to claim 1, wherein the removing the first and second protective films is performed with a dummy substrate placed on an electrostatic chuck inside the chamber.

6. The plasma processing method according to claim 5, further comprising: cleaning a surface of the electrostatic chuck by the plasma of the third processing gas after the dummy substrate is carried out from the chamber.

7. The plasma processing method according to claim 5, wherein the dummy substrate is separated from a surface of the electrostatic chuck by a distance greater than 8 mm during the removing the first protective film.

8. The plasma processing method according to claim 1, wherein the inner member of the chamber is made of Si or quartz.

9. The plasma processing method according to claim 3, wherein the silicon-containing gas is an aminosilane-based gas or a silicon alkoxide-based gas.

10. The plasma processing method according to claim 1, wherein the second protective film contains a metal, and the fifth processing gas includes a halogen-containing gas.

* * * * *